United States Patent [19]

Kumar et al.

[11] 4,261,763

[45] Apr. 14, 1981

[54] FABRICATION OF INTEGRATED CIRCUITS EMPLOYING ONLY ION IMPLANTATION FOR ALL DOPANT LAYERS

[75] Inventors: Rakesh Kumar; Merrill Hunt, both of Escondido, Calif.

[73] Assignee: Burroughs Corporation, Detroit, Mich.

[21] Appl. No.: 80,618

[22] Filed: Oct. 1, 1979

Related U.S. Application Data

[63] Continuation of Ser. No. 931,627, Aug. 7, 1978, abandoned.

[51] Int. Cl.³ .................... H01L 21/263; H01L 27/04
[52] U.S. Cl. ................................ 148/1.5; 29/578; 148/187; 357/34; 357/50; 357/91
[58] Field of Search ..................... 148/1.5, 187, 175; 29/578; 357/34, 91, 50

[56] References Cited

U.S. PATENT DOCUMENTS

| | | | |
|---|---|---|---|
| 3,961,356 | 6/1976 | Kooi | 357/50 |
| 4,066,473 | 1/1978 | O'Brien | 148/1.5 |
| 4,110,779 | 8/1978 | Rathbone et al. | 357/34 |
| 4,111,724 | 9/1978 | Ogiue | 148/175 |
| 4,149,915 | 4/1979 | Bohg et al. | 148/186 |
| 4,175,983 | 11/1979 | Schwabe | 148/1.5 |
| 4,187,125 | 2/1980 | Feist | 148/1.5 |
| 4,191,595 | 3/1980 | Aomura et al. | 148/1.5 |

OTHER PUBLICATIONS

Evans et al., IEEE J. Solid State Circuits, vol. SC-8, 1973, 373.

*Primary Examiner*—L. Dewayne Rutledge
*Assistant Examiner*—Upendra Roy
*Attorney, Agent, or Firm*—Charles J. Fassbender; Kevin R. Peterson

[57] ABSTRACT

This disclosure relates to a method of fabricating an integrated circuit wherein all dopant layers are formed by ion implantation. More specifically, the buried collector of a bipolar integrated circuit is formed by ion implantation which collector has a high density of dopant species and is formed relatively deep into the substrate on which the circuit is formed. In addition, in order to reduce the number of steps employed in the fabrication, certain of the implanted species can be activated during the same high temperature annealing step. A pre-aligned mask is employed for the formation of the base contact, collector contact, and emitters, which mask can be selectively opened with a reduced number of masking steps. With such a mask, the base contact, collector contact and emittor are self-aligned even though formed at different steps in the process.

6 Claims, 5 Drawing Figures

FABRICATION OF INTEGRATED CIRCUITS EMPLOYING ONLY ION IMPLANTATION FOR ALL DOPANT LAYERS

This is a continuation of application Ser. No. 931,627, filed Aug. 7, 1978, now abandoned.

U.S. patent applications directly or indirectly related to the subject application are the following: Ser. No. 931,626 filed Aug. 7, 1978, now abandoned by Rakesh Kumar, et al. and entitled "INTEGRATED CIRCUITS HAVING OXIDE ISOLATION WITH ION IMPLANTED BORON CHANNEL STOPPERS."

BACKGROUND OF THE INVENTION

1. Field of the Invention

This invention relates to the fabrication of integrated circuits and more particularly to such fabrication employing ion implantation for all dopant layers.

2. Description of the Prior Art

Conventional processes of the fabrication of integrated circuits, and more particularly bipolar integrated circuits, employ a number of masking steps to implement the growth of epitaxial oxides and other layers, the etching of those layers and the substrate as well as diffusion of impurities into those layers and so forth. The greater the number of steps that are involved, the greater the time required and the cost of fabrication of such circuits. Furthermore, as the number of masking steps increases, the alignment of such masks requires greater tolerances with the result that the resolution to which the masks can be made is decreased and the dimensions of the devices being formed are increased. This results in a reduction in the packing density of the circuits being formed on the chip. Furthermore, the greater the number of high temperature processes the greater is the growth of crystal defects that limit the yield of good devices.

A particular fabrication technique that allows for a reduction in process and masking steps is the employment of ion implantation. Ion implantation allows for controlled dimensions and more shallow and smaller regions to be created in the semiconductor substrate. The extensive use of ion implantation requires a less number of thermal processing steps for annealing and dopant drive-in as well as a reduction in the use of wet chemicals and toxic gases. It provides for improved device parameter control and the independent control of different device parameters. Although ion implant has been employed in both bipolar and MOS integrated circuits, not all the doping layers of the bipolar device have been created by ion implantation, particularly in the case of the buried collector. This is primarily because of the damage caused to the substrate by the heavy concentration of ions or dopants required to form the collector region.

Another technique that allows for smaller dimensions has been the development of alignment processes whereby different elements of the integrated circuit devices are formed by different portions of the same mask. Examples of self-aligning processes include the Sanera U.S. Pat. No. 3,560,278; the Hunt, et al. U.S. Pat. No. 4,021,270; and the Schwettmann U.S. Pat. No. 3,928,082. The employment of self-alignment for the emitter, base and collector contacts with the same mask, requires fewer etching steps and thus fewer fabrication and handling steps.

Another technique that allows for smaller dimensions has been the development of isolating the individual devices by surrounding them with nonconductive regions. This allows for the devices to be placed closer together without leakage occuring in the substrate between devices and improves performance by reduction of parasitic capacitances. Such techniques include the provision of oxide regions around the individual devices as opposed to the conventional technique of diffusion of dopants which cause a different conductivity so as to achieve junction isolation. Such techniques, particularly the oxide isolation technique, require that the oxide region be gworn through an upper epitaxial region to the silicon substrate, however, such oxide regions are not always buried to a sufficient depth to provide proper isolation without using excessive temperatures or causing undue lack of planarity of the devices surface. Furthermore, in prior art bipolar devices, the buried collector region is formed in the silicon substrate and then an epitaxial silicon layer is grown thereover. The isolation regions are then grown in the epitaxial region. If the isolating regions are not formed to sufficient depth leakage begins to occur between the devices.

It is then an object of the present invention to provide an improved process for the fabrication of integrated circuits.

Is it another object of the present invention to provide an improved process for the fabrication of bipolar devices which require fewer fabrication and handling steps.

It is still another object of the present invention to provide improved process for high performance, high density, high yield potential bipolar circuits.

It is a further object of the present invention to provide an improved bipolar integrated circuit wherein all dopant layers are formed by ion implantation.

SUMMARY OF THE INVENTION

In order to achieve the above-identified objects, the present invention is directed to a method of fabricating an integrated circuit wherein a buried collector of a high density of ions is formed relatively deep into the substrate on which the circuit is formed.

A feature of the present invention then resides in a bipolar integrated circuit having a base, an emitter and a buried collector all of which are formed by ion implantation. An additional feature resides in the enhancement of the base area by implantation.

Another feature of the present invention resides in the method of fabricating an integrated circuit through the employment of a silicon dioxide-silicon nitride mask with which the base contact, emitter and collector contacts can be defined.

DESCRIPTION OF THE DRAWINGS

The above and other objects, advantages and features of the present invention will become more readily apparent from a review of the following specification when taken in conjunction with the drawings wherein.

GENERAL DESCRIPTION OF THE INVENTION

A typical bipolar semiconductor device is created by first forming a buried collector in a silicon substrate and then growing an epitaxial silicon layer thereover. A series of masking, etching, diffusion and/or ion implant steps are then performed to create the base and emitter areas in the epitaxial layer as well as the isolation areas around the device. The sequence of such individual steps in succession increases the time and cost of the fabrication of the resultant devices.

In the present invention, the employment of ion implantation allows two or more implanting operations to be performed without the requirement for separate etching steps. Furthermore, the fabrication process of the present invention employs an oversized mask which can be employed with a reduction in alignment processes between the emitter and contact masks and this allows for high density devices.

Also, in the present invention, the provision of channel stop areas underneath the isolating region assures that the isolating region is sufficiently deep into the substrate so as to prevent any unwanted conducting channels from being formed and prevents inversion due to interface charge.

Figure 1:
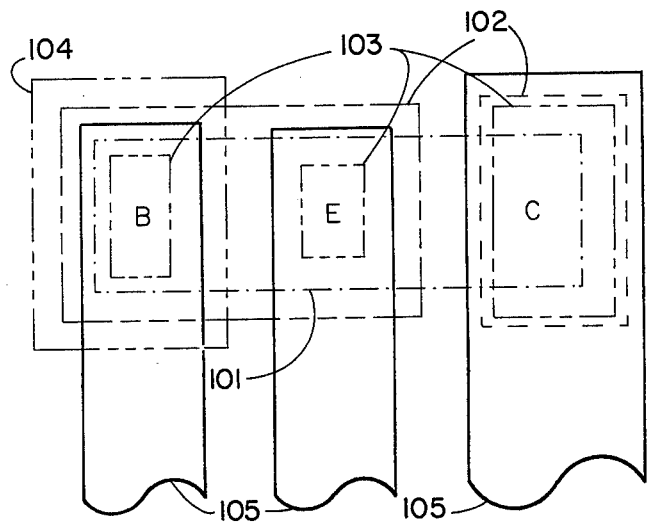
FIG. 1 is a plan view of the masks employed in the present invention.

A plan view illustrating the relation between the various elements of a device made by the present invention is illustrated in FIG. 1. More specifically, the plan view illustrates the various masks employed in the present invention. Generally the process involves the formation of a buried collector regions defined by mask 101. This is followed by the formation of the isolation region defined by mask 102. The mask 101 may or may not be expanded to cover the areas under mask 102. The base contact B, the emitter E and the collector C are then defined by mask 105. A portion of the base region is then enhanced as defined by mask 104 and finally the metal connectors for the base, emitter and collector are defined by mask 105.

Figure 2:
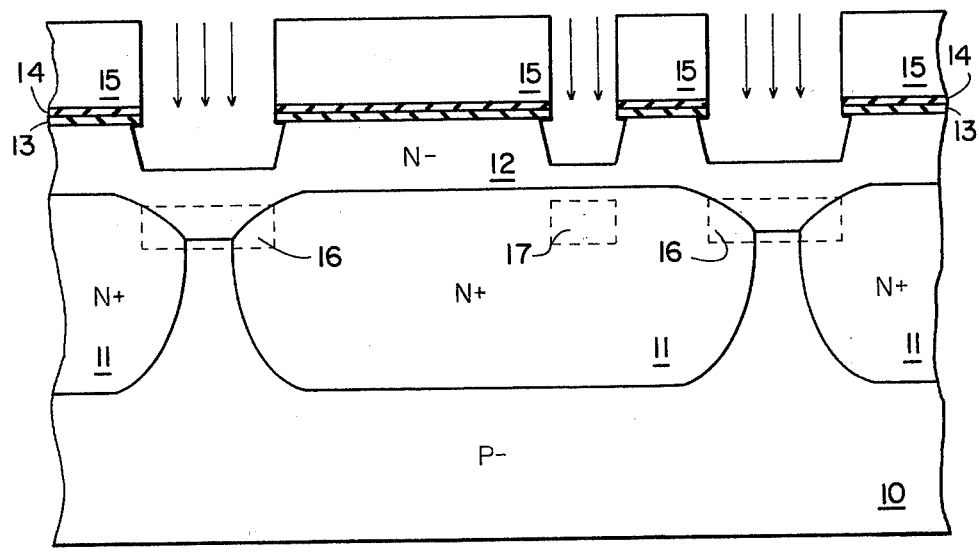
FIGS. 2–5 are cross-sectional views of a device fabricated by the present invention after successive steps in the fabrication process.
Figure 3:
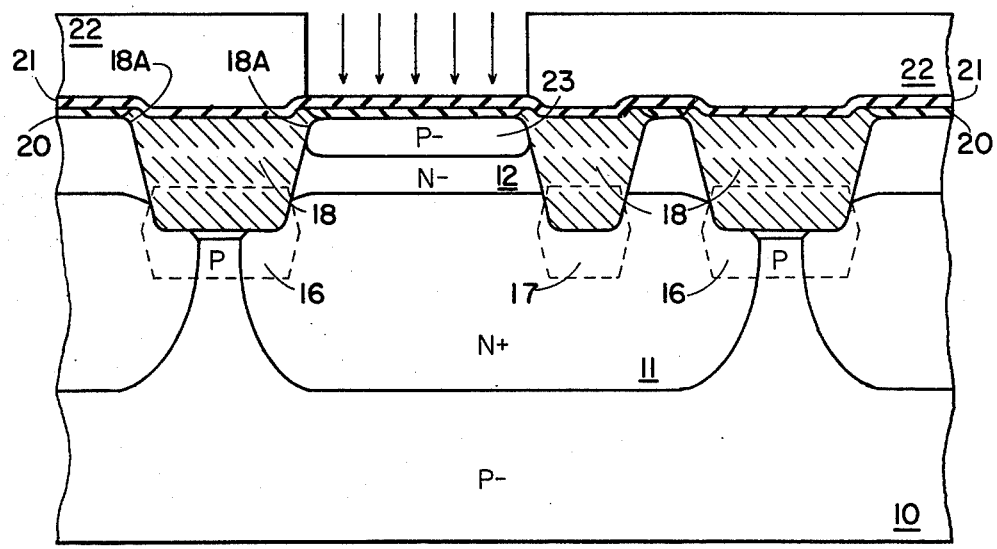

The process in the present invention will now be described in relation to FIGS. 2–5. With reference to FIG. 2, P-substrate 10 is implanted with N+ buried collector regions 11 which are defined by an oxide mask (not shown) which will be more thoroughly described below. The substrate is then subjected to an implant anneal cycle which removes crystal damage created by the implantation and causes the implanted ions of the buried collectors 11 to diffuse or drive-in to form the configurations shown in FIG. 2. N-epitaxial silicon layer 12 is then grown and an oxide-nitride mask is formed of silicon dioxide layer 13 and silicon nitride layer 14. Photoresist layer 15 is applied and the channel stop pattern formed therein for a subsequent process. The pattern thus formed corresponds to mask 102 of FIG. 1 and is etched through the respective nitride layer 14 and oxide layer 13 and into the epitaxial silicon layer 12. The etching of the silicon may undercut the masks thus formed by oxide layer 13 and nitride layer 14. Boron ions are then implanted through the pattern thus formed to form the respective channel stop implants 16 and 17. Photoresist layer 15 is then removed and oxide isolation areas 18 are selectively grown as illustrated in FIG. 3. The original nitride layer 14 and oxide layer 13 are then removed.

As illustrated in FIG. 3, the channel stop implants 16 and 17 lie at the bottom of the field oxide regions 18, but do not surround its sides. One problem with having a layer of channel stop dopant atoms surround the field oxide is that it acts to extend the base region. Therefore, the collector-base junction capacitance of the transistor is increased; and this in turn slows down the operation of the device.

Another problem with placing channel stop dopant layer entirely around the field oxide is that it places severe limitations on the doping of the collector region. Suppose for example that the collector is doped relatively lightly in comparison to the layer which surrounds the field oxide. Under such conditions, the base region of a transistor on one side of the field oxide will short to the base region of another transistor on the opposite side of the field oxide. To avoid this problem, the collectors are restricted to be doped substantially heavier than the doped layer around the field oxide.

Still another problem is that the doping level of the emitter is severely restricted. Those emitters must also always be doped heavier than the layers which surround the field oxide. Otherwise, any metal contact to the emitter which bordered on the field oxide would short to the base region and form a Schottky diode between the two.

Referring now to FIG. 3, new oxide layer 20 and nitride layer 21 are formed. A new photoresist layer 22 is applied to form an oversized base mask which will protect the collector areas yet to be formed. Since the mask overlaps the active device area around birds head region 18A it causes the base region to be rounded up into the nonconductive region 18. Base area 23 is formed by implanted boron ions through oxide layer 20 and nitride layer 21. Photoresist layer 22 is then removed. There is no etching involved and no high temperature processing involved.

This combination of steps insures that when a metal contact is made from the field oxide perimeter to the base region, that it will also not make any contact with the underlying N type epi layer 12 near the field oxide. Such contact would form an undesirable Schottky diode between the base and collector. Similarly, the above combination of steps insures that the dopant atoms which are introduced through a hole that extends from the field oxide to form the emitter do not form a short to the collector near the field oxide region.

Figure 4:
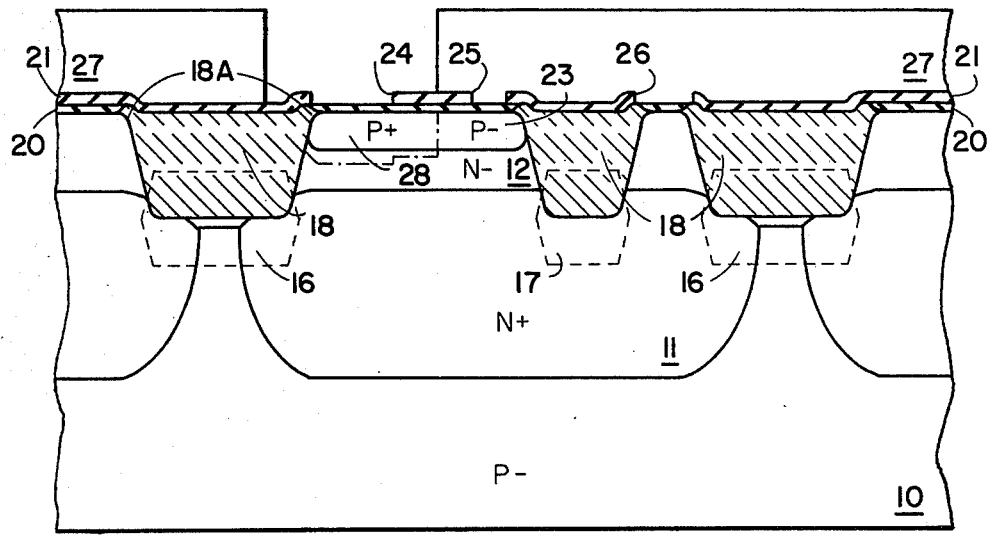

The next series of steps will now be described with relation to FIG. 4. As illustrated therein, the single masking step is employed to define the respective base contacts, emitters and collector contacts. This results in the opening of base contact via 24, emitter via 25, and collector contact via 26, which vias are etched only through nitride layer 21. During this particular step, other vias may be opened in the wafer for the subsequent creation of Schottky diodes, resistors and the like. Then photoresist layer 27 is applied to define masks for the enhancement of the base region under the base contact via 24. With the photoresist mask 27 in place, boron ions are implanted to create base enhanced region 28, which implantation is through the base contact via 24, and also through the surrounding nitride layers 21 and oxide layers 20, so that the profile of the base enhancement area 28 will be as illustrated in FIG. 4. Photoresist layer 27 is then removed. There is no etching step involved. At this point one may introduce an annealing step for the implanted base and enhancement regions, depending on the device characteristics required.

Oxide layers 20 under the base contact via 24, the emitter via 25 and the collector contact via 26 are etched part way through the oxide layer 20. An oversized mask is then formed in a photoresist layer (not shown) to protect the base contact vias 24 while opening the vias 25 and 26. The remaining oxide layer 20 is then removed from 25 and 26. Emitter region 29 and collector N+ region 30 are then formed by implanting arsenic ions while employing the corresponding oxide layer 20, nitride layer 21 and the protective photoresist layer over 24 as the implant mask. This is followed by a low temperature implant anneal cycle and then an implant drive-in cycle for the base, resistor and emitter areas. During this drive-in cycle, oxide is grown in areas 24 and 25 such that the amount of this oxide is nearly equal to the oxide remaining in base contact via 24. Without any additional masking the remaining oxide 20 is removed from all vias 24, 25, 26 and a metal conductive layer 31 (FIG. 5) is then deposited and etched to respectively form base contact 31A, emitter contact 31B and collector contact 31C. The remaining steps in the process are conventional and will not be shown, but include an intermetal dielectric deposition and via openings, a second metal deposition, a passivation dielectric deposition, a pad etch and subsequent packaging of the chip.

DETAILED DESCRIPTION OF THE INVENTION

As was indicated above, the buried collector layer is formed by ion implant as distinct from the prior art. This is not the process of the prior art as heavy doping of the collector was required and this was normally achieved by diffusion. Referring to FIGS. 2-5, it will be noted that buried collector 11 resides to some depth within substrate 10. Collector layer 11 is achieved by ion implant of arsenic to achieve the N+ collector region. A particular problem, when such a collector layer is ion implanted, is to prevent the oxide mask that defines the collector region, from being bombarded by the arsenic atoms. Such bombardment knocks oxide atoms from the silicon oxide mask into the surface of the collector region. This "knockon" problem causes defects in the collector region which grow into a stacking fault or a dislocation loop type of defect. These defects can limit the performance and quality of the devices being built.

Figure 2A:
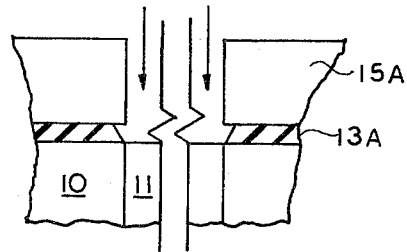
Figure 5A:
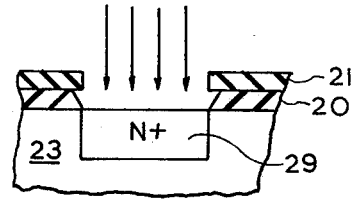

In order to overcome this "knockon" problem, the photoresist mask 15A (FIG. 2A) employed to define the mask openings is retained and the underlying oxide is undercut by etching so that, during the ion implantation, the oxide mask is not seen by the accelerated ions. The purpose of the oxide mask 13A (FIG. 2A) then, is to provide a better adhesion of the photoresist pattern and to keep the definition of the buried collector region during the anneal and drive-in processing. It also prevents the redeposition of any evaporated arsenic, during the drive-in step on unwanted areas of the substrate. The same "knockon" problem as referred to above can also exist during the ion implantation of emitter region 29 in FIG. 5. However, in this situation, the oxide layer 20 is normally undercut during the etching step which opens emitter via 25 (as illustrated in FIG. 5A) so that the implanted ions only see nitride layer 21. The same procedure is used for formation of collector contact region 30 in FIG. 5.

More specific details of the invention will now be described with reference to FIGS. 2-5. Buried collector 11 in FIG. 2 is formed by the implantation of arsenic ions with an energy of 35,000 electron volts (35 KeV) to a density of $4 \times 10^{15}$ ions per square centimeter. After the implant anneal or drive-in cycle, epitaxial layer 12 is formed to a thickness of 2 micrometers. Silicon dioxide layer 13 is formed to a thickness of approximately 500 angstroms and then silicon nitride layer 14 is deposited to a thickness of approximately 2,000 angstroms. The silicon is etched to a depth of about 7000 angstroms. Channel stops 16 and 17 are formed by implantation of boron ions at an energy of 400 KeV to a density of $5 \times 10^{13}$ ions per square centimeter. Oxide isolation areas 18 and 19 are then grown to a depth of 2 micrometers.

Referring now to FIG. 3, the oxide-nitride mask is again formed, oxide layer 20 being grown to a depth of 2,000 angstroms and nitride mask 21 being deposited to a thickness of 1,500 angstroms. Photoresist mask 22 is then patterned to define base region 23 which mask is oversized. Base region 23 is formed by implanting boron ions at an energy of 200 KeV to a density of approximately $10^{14}$ ions per square centimeter so as to have a sheet resistivity of approximately 600 ohms per square centimeter. It is to be remembered that this implant is through the oxide-nitride masks and does not require any etching operation.

It should be noted that the base implant and the base enhancement steps can be reversed.

Referring now to FIG. 4, base contact via 24, emitter via 25, and collector contact via 26 are etched only in nitride layer 21. Then, photoresist mask 27 is patterned to form base enhancement area 28. Mask 27 is oversized but only in the direction away from emitter via 25, then base enhancement region 28 is formed by implanting boron ions with an energy of 200 KeV to a density of approximately $7 \times 10^{14}$ ions per square centimeter to provide a sheet resistivity of approximately 150 ohms per square centimeter. It will be remembered that other resistors in the circuit can be formed during this same process.

Figure 5:
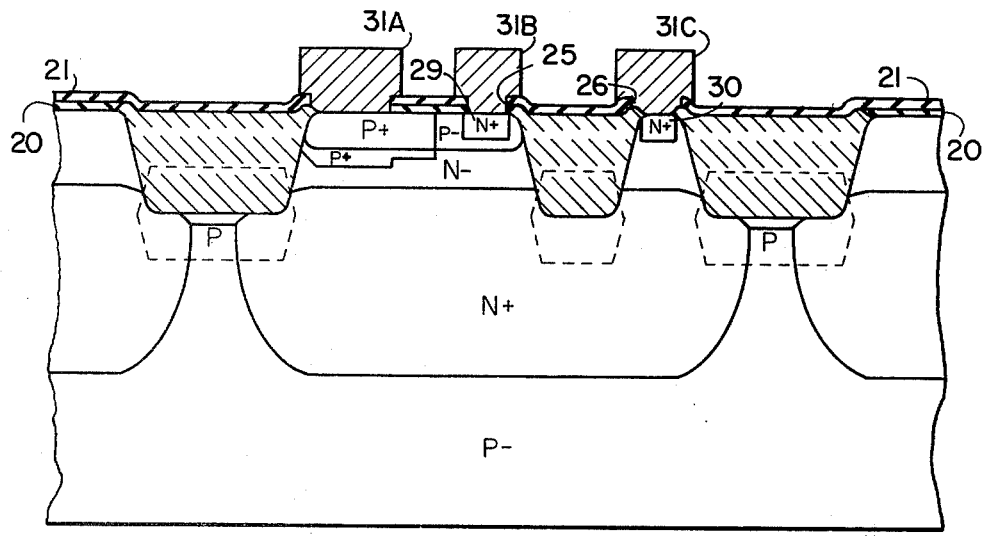

Photoresist mask 27 is then stripped and emitter regions 29 and collector contact region 30 are formed by implanting arsenic ions with an energy of 35 KeV to provide a density of $4 \times 10^{15}$ ions per square centimeter. This is illustrated in FIG. 5. After that, the respective metal contacts 31A, 31B and 31C are deposited as was described above.

EPILOGUE

A method of fabricating an integrated circuit has been disclosed wherein all dopant layers are formed by ion implantation. Certain of the elements can be implanted during the same implantation step. A double layer mask is employed for the formation of the base contacts, emitter and collector contacts so that the base contact, collector contact and emitter are self-aligned even though formed at different steps in the process.

While one embodiment and variations thereof have been disclosed, it will be obvious to one skilled in the art that other variations and modifications can be made therein without departure from the spirit and scope of the invention as claimed.

What is claimed is:

1. A method of fabricating a vertical bipolar transistor on a substrate having a major surface and being of one conductivity type; said method including the steps of:

implanting a region in said substrate with atoms of a second conductivity type to form a collector for said transistor;

growing an epitaxial layer of said second conductivity type on said surface of said substrate covering said collector;

implanting in said substrate and said layer a doped channel stop region which surrounds and terminates in said collector;

growing in said layer a field oxide region which contacts and extends above said doped channel stop region;

forming a mask for the base region of said transistor with an oversized opening to uniformly expose the entire perimeter of said field oxide;

implanting atoms of said one type to a uniform depth through said opening and said exposed perimeter to form a base which terminates throughout its width in said field oxide; and forming a base contact and an emitter region which extend from respective portions of said field oxide onto said base.

2. A method according to claim 1, wherein said atoms of said one conductivity type are P-type and said atoms of said second conductivity type are N-type.

3. A method according to claim 1, wherein said atoms of said one conductivity type are N-type and said atoms of said second conductivity type are P-type.

4. A method according to claim 1 and further including the steps of:
forming a dielectric layer over said field oxide and epitaxial layer prior to said mask forming step; and
subsequently forming said base by implanting said atoms through said dielectric layer.

5. A method according to claim 4, wherein said dielectric layer includes silicon nitride.

6. A method according to claim 4 and further including the steps of:
opening two holes in said dielectric layer to define said base contact region and emitter region; and
subsequently covering one hole while locally doping the base through the other hole to form said emitter.

* * * * *